United States Patent
Toriyama

(10) Patent No.: US 9,318,193 B2
(45) Date of Patent: Apr. 19, 2016

(54) SEMICONDUCTOR MEMORY DEVICE

(71) Applicant: Kabushiki Kaisha Toshiba, Minato-ku (JP)

(72) Inventor: Shuichi Toriyama, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/491,086

(22) Filed: Sep. 19, 2014

(65) Prior Publication Data
US 2015/0206580 A1 Jul. 23, 2015

(30) Foreign Application Priority Data

Jan. 22, 2014 (JP) ................. 2014-009342

(51) Int. Cl.
*G11C 11/00* (2006.01)
*G11C 13/00* (2006.01)

(52) U.S. Cl.
CPC ........ *G11C 13/0007* (2013.01); *G11C 13/0028* (2013.01); *G11C 13/0069* (2013.01); *G11C 2013/008* (2013.01); *G11C 2213/32* (2013.01); *G11C 2213/71* (2013.01); *G11C 2213/77* (2013.01); *G11C 2213/78* (2013.01)

(58) Field of Classification Search
USPC ........................................................ 365/148
See application file for complete search history.

(56) References Cited

U.S. PATENT DOCUMENTS

| 8,139,396 B2 | 3/2012 | Kurosawa et al. |
| 8,426,839 B1 | 4/2013 | Ma et al. |
| 2008/0232160 A1 | 9/2008 | Gopalakrishnan |
| 2013/0148400 A1 | 6/2013 | Murooka |
| 2013/0148440 A1 | 6/2013 | Wang et al. |
| 2014/0061577 A1* | 3/2014 | Kanno ................... H01L 45/04 257/5 |

FOREIGN PATENT DOCUMENTS

| JP | 2010-519762 A | 6/2010 |
| JP | 2010-225218 A | 10/2010 |

(Continued)

OTHER PUBLICATIONS

Panasonic Press Release, http://panasonic.co.jp/corp/news/official.data/data.dir/jn120223-1/jn120223-1.html, Feb. 23, 2012.

(Continued)

*Primary Examiner* — Hoai V Ho
(74) *Attorney, Agent, or Firm* — Oblon, McClelland, Maier & Neustadt, L.L.P.

(57) ABSTRACT

A semiconductor memory device according to an embodiment comprises: a plurality of first lines extending in a first direction perpendicular to a substrate surface and arranged with a certain pitch in a second direction parallel to the substrate surface; a plurality of second lines extending in the second direction and arranged with a certain pitch in the first direction; a memory cell provided at an intersection of the first line and the second line and including a variable resistance element; a third line provided extending in the second direction between the plurality of second lines; and a control circuit capable of executing a first operation that changes a resistance value of the variable resistance element by applying a voltage to the memory cell via the first line and the second line, and a second operation that supplies heat to the memory cell using the third line.

5 Claims, 7 Drawing Sheets

(56) References Cited

FOREIGN PATENT DOCUMENTS

JP      2013-120618 A     6/2013
WO      WO 2010/140210 A1  12/2010

OTHER PUBLICATIONS

Rainer Waser, "Redox-based Resistive Switching Memories—the Mystery of Nanoionic Process", IEDM, 2011, 59 pages.

Shimeng Yu et al., "On the Stochastic Nature of Resistive Switching in Metal Oxide RRAM: Physical Modeling, Monte Carlo Simulation, and Experimental Characterization", IEDM tech. dig., 2011, pp. 413-416.

Ugo Russo et al., "Self-Accelerated Thermal Dissolution Model for Reset Programming in Unipolar Resistive Switching Memory (RRAM) Devices", IEEE Trans. Electron. Dev., vol. 56, No. 2, Feb. 2009, pp. 193 (2009).

* cited by examiner

SEMICONDUCTOR MEMORY DEVICE

CROSS REFERENCE TO RELATED APPLICATION

This application is based on and claims the benefit of priority from Japanese Patent Application 2014-09342, filed on Jan. 22, 2014, the entire contents of which are incorporated herein by reference.

FIELD

Embodiments of the present specification relate to a semiconductor memory device.

BACKGROUND

Conventionally proposed is a semiconductor memory device including a variable resistance element whose resistance value changes due to application of a voltage. The variable resistance element can have its resistance value lowered by a setting operation (write operation), and can have its resistance value raised by a resetting operation (erase operation). Moreover, conventionally known is a semiconductor memory device including a three-dimensionally structured type of memory cell array having wiring lines formed in a perpendicular direction to a substrate.

DETAILED DESCRIPTION

A semiconductor memory device according to an embodiment comprises: a plurality of first lines extending in a first direction perpendicular to a substrate surface and arranged with a certain pitch in a second direction parallel to the substrate surface; a plurality of second lines extending in the second direction and arranged with a certain pitch in the first direction; a memory cell provided at an intersection of the first line and the second line and including a variable resistance element; a third line extending in the second direction between the plurality of second lines; and a control circuit capable of executing a first operation that changes a resistance value of the variable resistance element by applying a voltage to the memory cell via the first line and the second line, and a second operation that supplies heat to the memory cell using the third line.

A semiconductor memory device according to a different embodiment to the above comprises: a plurality of first lines that are columnar and extend in a first direction intersecting a substrate surface; a plurality of second lines extending between the plurality of first lines in a second direction along the substrate surface and having at least two or more columns of the second lines provided in the first direction; a memory cell provided at an intersection of the first line and the second line and including a variable resistance element; a switch element whose one end is commonly connected to the plurality of second lines and whose other end is connected to a certain potential; and a control circuit capable of executing a first operation that changes a resistance value of the variable resistance element by applying a voltage to the memory cell via the first line and the second line, and a second operation that heats the second line by setting the switch element to on and thereby supplies heat to the memory cell.

A semiconductor memory device according to embodiments will be described below with reference to the drawings.

First Embodiment

Figure 1:
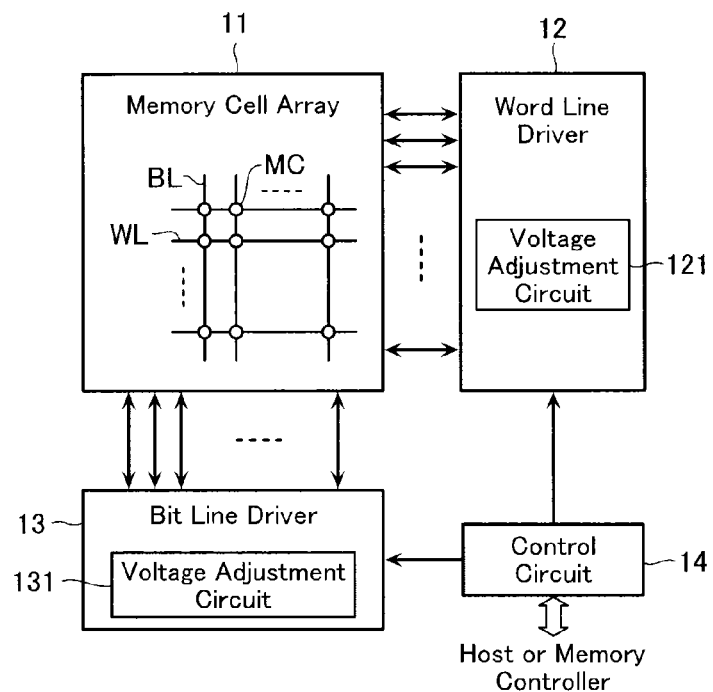
FIG. 1 is a block diagram showing a configuration of a semiconductor memory device according to a first embodiment.

FIG. 1 is a block diagram showing a configuration of a semiconductor memory device according to a first embodiment. Said semiconductor memory device comprises a memory cell array 11, a word line driver 12, a bit line driver 13, and a control circuit 14. The memory cell array 11 includes a bit line BL and a word line WL that extend in mutually intersecting directions, and has a memory cell MC provided at an intersection of said bit line BL and word line WL. As will be described later, the memory cell MC includes a variable resistance element capable of storing data by a level of a resistance value.

The word line driver 12 includes a voltage adjustment circuit 121 and is connected to the word line WL and the control circuit 14. The voltage adjustment circuit 121 generates various kinds of voltages including a selected word line voltage and an unselected word line voltage. The word line driver 12 supplies the various kinds of voltages to the word line WL based on an address provided from the control circuit 14.

The bit line driver 13 includes a voltage adjustment circuit 131 and is connected to the bit line BL and the control circuit 14. The voltage adjustment circuit 131 generates various kinds of voltages including a selected bit line voltage and an unselected bit line voltage. The bit line driver 13 supplies the various kinds of voltages to the bit line BL based on an address provided from the control circuit 14.

The control circuit 14 controls the word line driver 12 and the bit line driver 13 based on a command inputted from an external host or a memory controller. Due to the above operation, the selected word line WL and the selected bit line BL are applied with a certain voltage, and a setting operation or a resetting operation are executed on the memory cell MC.

Now, the setting operation is an operation for causing the variable resistance element (not illustrated) in the memory cell MC to undergo transition from a high-resistance state (reset state) to a low-resistance state (set state), and corresponds to a write operation of data. The resetting operation is an operation for causing the variable resistance element in the memory cell MC to undergo transition from the low-resistance state (set state) to the high-resistance state (reset state), and corresponds to an erase operation of data.

Figure 2:
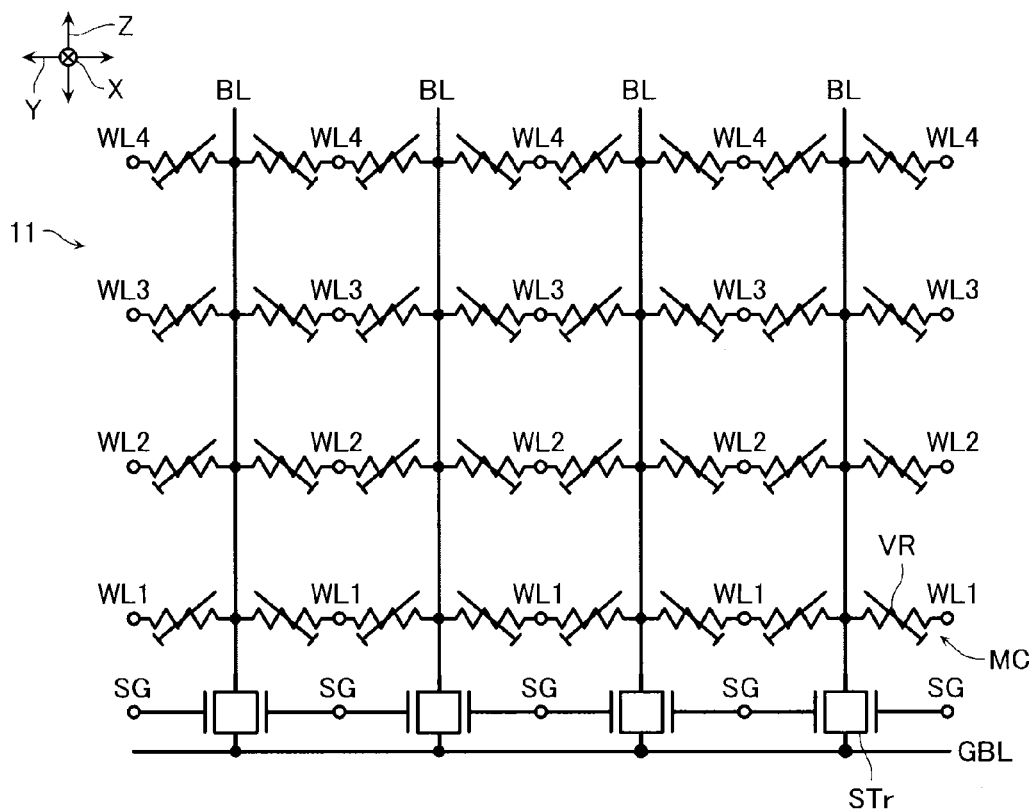
FIG. 2 is a circuit diagram showing a configuration of a memory cell array of the semiconductor memory device according to the first embodiment.

FIG. 2 is a circuit diagram showing a configuration of the memory cell array. In FIG. 2, an X direction, a Y direction, and a Z direction are mutually orthogonal, and the X direction is a direction perpendicular to the plane of paper. A structure shown in FIG. 2 is provided repeatedly in the X direction. The memory cell array 11 includes a select transistor STr, a global bit line GBL, and a select gate line SG, besides the previously-mentioned word line WL, bit line BL, and memory cell MC.

The word lines WL extend in the X direction and are arranged having a certain pitch in the Y direction and the Z direction. In FIG. 2, that word line of the word lines WL arranged in the Z direction which is disposed on a nearest side to the select gate line SG is notated as WL1, and those word lines increasingly distant from the select gate line SG are notated as, in order, WL2, WL3, and WL4. The bit lines BL extend in the Z direction and are disposed in a matrix having a certain pitch in the X direction and the Y direction. The memory cell MC is disposed in a region where the word line WL and the bit line BL intersect, and includes the variable resistance element. As illustrated, the word line WL is shared by two memory cells MC.

The select transistor STr is provided between the global bit line GBL and one end of the bit line BL. The global bit lines GBL extend in the Y direction and are arranged having a certain pitch in the X direction. One global bit line GBL is commonly connected to one ends of the plurality of select transistors STr arranged in the Y direction. That is, one global bit line GBL is commonly connected to one ends of the plurality of bit lines BL arranged in the Y direction.

The select gate lines SG extend in the X direction and are arranged having a certain pitch in the Y direction. One select gate line SG is commonly connected to gates of the plurality of select transistors STr arranged in the X direction.

Figure 3:
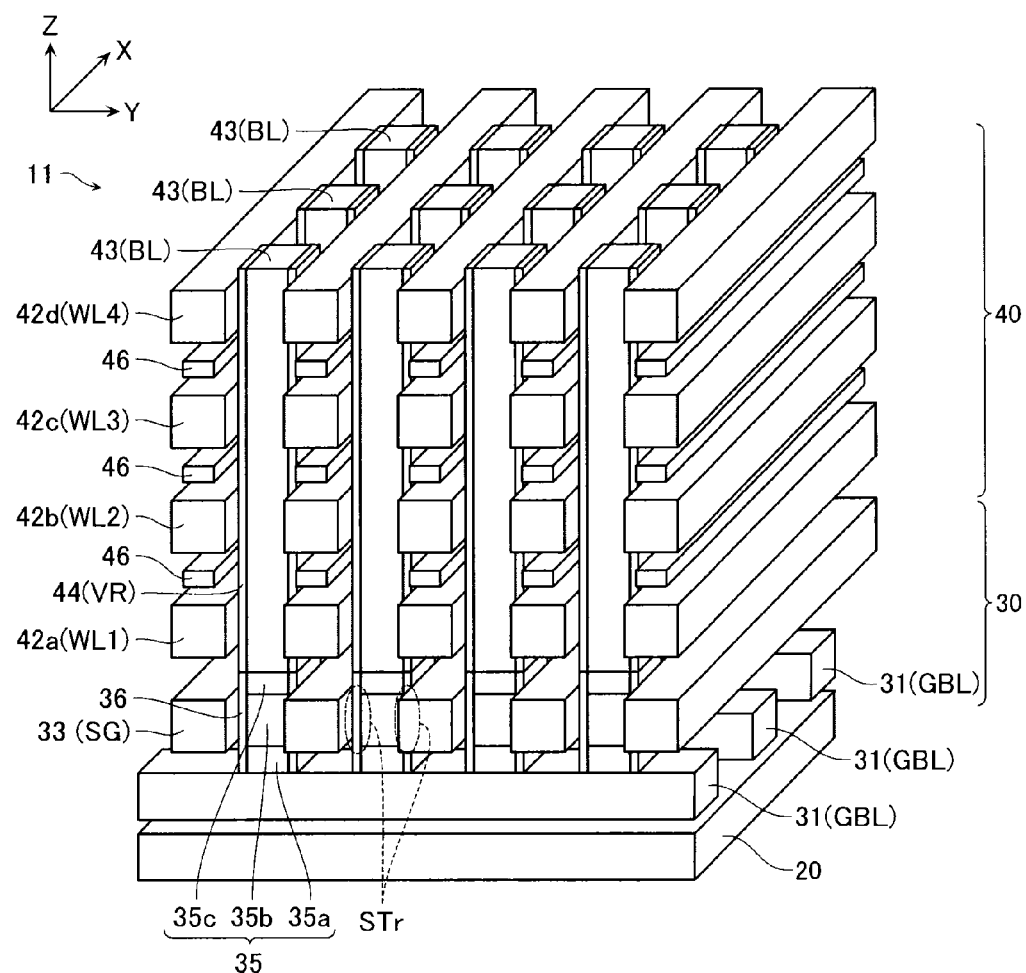
FIG. 3 is a schematic perspective view showing the configuration of the memory cell array of the semiconductor memory device according to the first embodiment.
Figure 4:
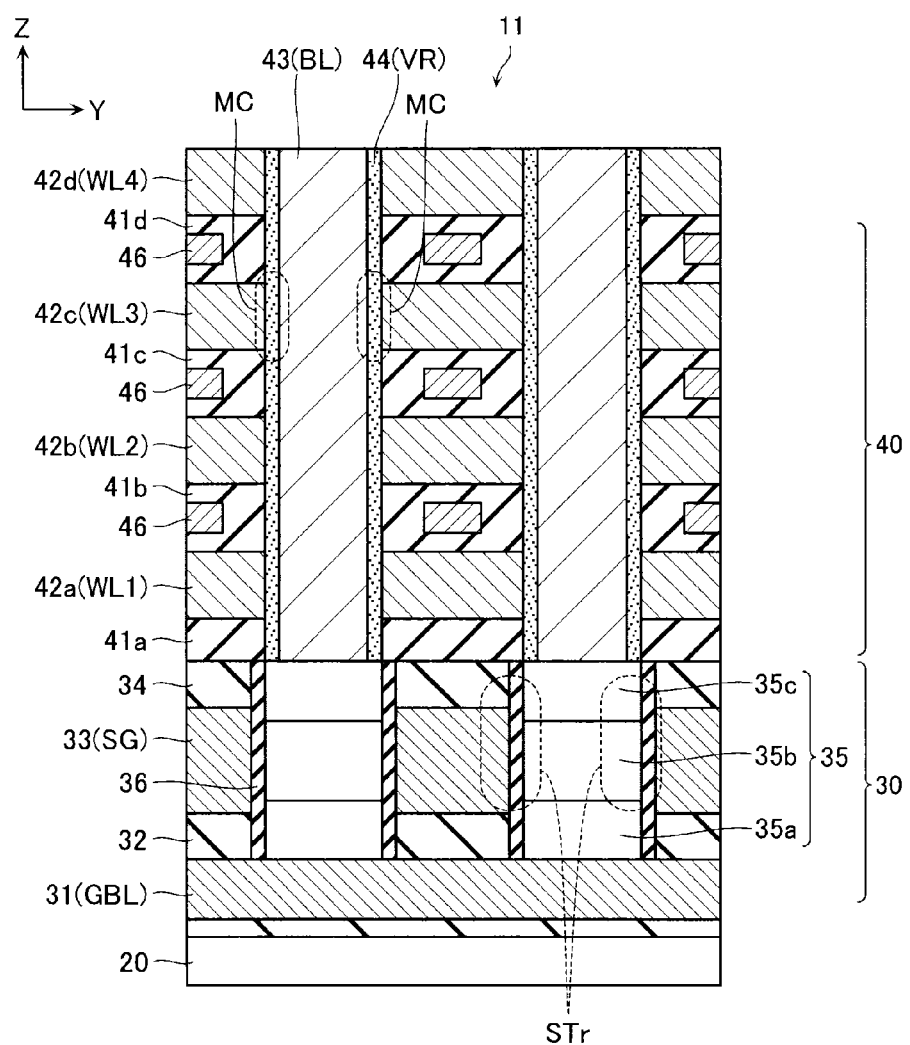
FIG. 4 is a cross-sectional schematic view showing the configuration of the memory cell array of the semiconductor memory device according to the first embodiment.
Figure 5:
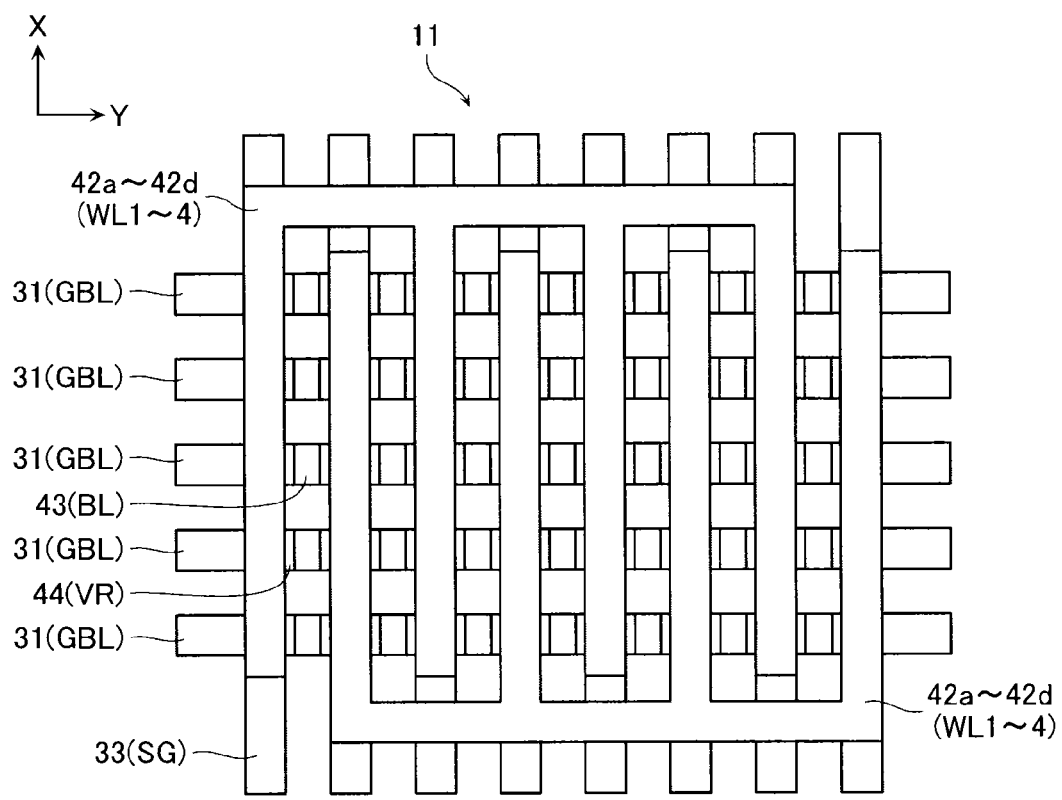
FIG. 5 is a top schematic view showing the configuration of the memory cell array of the semiconductor memory device according to the first embodiment.

FIG. 3 is a schematic perspective view showing the configuration of the memory cell array. FIG. 4 is a cross-sectional view along a Z-Y plane of FIG. 3, and FIG. 5 is a plan view looking at the memory cell array of FIG. 3 from an upper surface side (opposite side to the substrate) in the Z direction. The memory cell array 11 includes a select transistor layer 30 and a memory layer 40 stacked on a substrate 20. The select transistor layer 30 has a plurality of select transistors STr disposed therein, and the memory layer 40 has a plurality of memory cells MC disposed therein.

As shown in FIGS. 3 and 4, the select transistor layer 30 includes a first conductive layer 31, a first inter-layer insulating layer 32, a second conductive layer 33, and a second inter-layer insulating layer 34 that are stacked in the Z direction (first direction) perpendicular to a principal plane of the substrate 20, sequentially, from a side of the substrate. The first conductive layer 31 functions as the global bit line GBL, and the second conductive layer 33 functions as a gate of the select transistor Str and as the select gate line SG. Moreover, the select transistor layer 30 includes a columnar semiconductor layer 35 and a gate insulating layer 36. The columnar semiconductor layer 35 functions as a body (channel) of the select transistor STr, and the gate insulating layer 36 functions as a gate insulating film of the select transistor STr.

The first conductive layers 31 extend in the Y direction (second direction) parallel to the principal plane of the substrate 20 and are arranged having a certain pitch in the X direction. The second conductive layers 33 extend in the X direction and are arranged having a certain pitch in the Y direction. The first conductive layer 31 and the second conductive layer 33 may be configured by, for example, polysilicon.

The first inter-layer insulating layer 32 is provided between the first conductive layer 31 and the second conductive layer 33. The second inter-layer insulating layer 34 is provided between the second conductive layer 33 and the memory layer 40. The first inter-layer insulating layer 32 and the second inter-layer insulating layer 34 may be configured by, for example, silicon oxide (SiO2).

As shown in FIGS. 3 and 4, the columnar semiconductor layers 35 are disposed in a matrix in the X direction and the Y direction and are formed extending in a column shape in the Z direction. The columnar semiconductor layer 35 contacts an upper surface of the first conductive layer 31 and contacts a side surface of the second conductive layer 33 via the gate insulating layer 36.

The columnar semiconductor layer 35 is configured, for example, having stacked sequentially therein from the substrate 20 side, an N+ type semiconductor layer 35a, a P+ type semiconductor layer 35b, and an N+ type semiconductor layer 35c. The N+ type semiconductor layers 35a and 35c are each configured by polysilicon implanted with an N+ type impurity, and the P+ type semiconductor layer 35b is configured by polysilicon implanted with a P+ type impurity. The gate insulating layer 36 is configured by, for example, silicon oxide (SiO2).

As shown in FIGS. 3 and 4, the memory layer 40 includes third inter-layer insulating layers 41a to 41d and third conductive layers 42a to 42d that are stacked alternately in the Z direction. The third conductive layers 42a to 42d respectively function as the word lines WL1 to WL4. As shown in FIG. 5, the third conductive layers 42a to 42d each include a pair of comb tooth shapes facing in the X direction. The third inter-layer insulating layers 41a to 41d may be configured by, for example, silicon oxide (SiO2). A material of the third conductive layers 42a to 42d will be described later.

Furthermore, the memory layer 40 includes a columnar conductive layer 43 and a variable resistance layer 44 (VR). The columnar conductive layers 43 are disposed in a matrix in the X direction and the Y direction and contact an upper surface of the columnar semiconductor layer 35, and are formed extending in a column shape in the Z direction. The columnar conductive layer 43 functions as the bit line BL. The variable resistance layer 44 is formed on a side surface of the columnar semiconductor layer 35 and between the third conductive layers 42a to 42d, and functions as a part of the memory cell MC that stores data. In this way, the memory cell MC is provided at an intersection of the word line WL and the bit line BL.

The columnar conductive layer 43 may be configured by a low-resistance semiconductor doped with an impurity in high concentration, or by a metal material. As mentioned above, this is because although the columnar semiconductor layer 35 is required to be a semiconductor in order to function as a body (channel) of the select transistor STr, the columnar conductive layer 43 does not have such a functional limitation. Of course, if the columnar conductive layer 35 and the columnar conductive layer 43 are of heterogeneous materials, then generally a contact resistance configured from a heterobarrier or a Schottky barrier occurs at their contact portion. This reduces a signal current amount able to flow in the bit line BL and ends up limiting a stacking number of the memory layer 40, that is, storage capacity of the semiconductor memory device. Considering this, it may be said that the columnar conductive layer 35 and the columnar conductive layer 43 are preferably of an identical material, therefore, the material configuring the columnar conductive layer 43 is preferably a material that is the semiconductor material configuring the columnar conductive layer 35 provided with a low electrical resistance. As mentioned above, here, the columnar conductive layer 35 is described as polysilicon, moreover, 35*c* that configures the columnar conductive layer 35 is assumed to be polysilicon implanted with an N+ type impurity. Therefore, the columnar conductive layer 43 is desirably polysilicon of low electrical resistance implanted with an N+ type impurity in high concentration.

The variable resistance layer 44 may be configured by, for example, an oxide insulator including a transition metal. Employable as said transition metal are, for example, hafnium (Hf), titanium (Ti), tantalum (Ta), zirconium (Zr), and so on. Alternatively, the variable resistance layer 44 may be an oxide semiconductor, provided it is high-resistance and has a low residual carrier concentration. Employable as said oxide semiconductor are, for example, gallium oxide ($Ga_2O_3$) which is a compound semiconductor of oxygen and gallium, or InGaZnO that has In or Zn crystallized in the gallium oxide, and so on. The third conductive layer 42 may be configured by, for example, a single metal the same as the transition metals included in the variable resistance layer 44 or a compound of the single metals, or platinum (Pt).

In addition, the memory layer 40 includes a later-described wiring line layer 46 for supplying heat to the memory cell. As shown in FIGS. 3 and 4, the wiring line layer 46 is formed buried inside the third inter-layer insulating layers 41*a* to 41*d* separated from the third conductive layers 42*a* to 42*d*, and extends in the X direction. A function of the wiring line layer 46 will be described in detail later.

When performing write/read/erase of data to the memory cell, the select gate lines SG positioned on both sides of the select transistor STr are applied with a certain voltage, and said select transistor STr is set to a conductive state. As a result, a certain voltage (for example, a ground potential) for write/read/erase is applied to the bit line BL from the global bit line GBL. Simultaneously to this, an arbitrary selected word line of the word lines WL1 to WL4 is applied with a certain selected voltage (for example, a power supply voltage), and the other word lines are applied with an unselected voltage (for example, a ground potential). Due to the above operation, a current flows in a region of the variable resistance layer 44 sandwiched by the selected bit line BL and word line WL, and write/read/erase of data is performed. As shown in FIG. 4, said regions each function as one memory cell MC.

Write of data (the setting operation) is performed by changing the resistance value of the variable resistance layer 44 from a first state (for example, the low-resistance state) to a second state (for example, the high-resistance state). Erase of data (the resetting operation) is performed by changing the resistance value of the variable resistance layer 44 from the second state to the first state. In the case of read of data of a plurality of memory cells, the resistance value of the variable resistance layer 44 does not change. Erase of data may be performed by a block unit of a batched plurality of memory cells.

Figure 6:
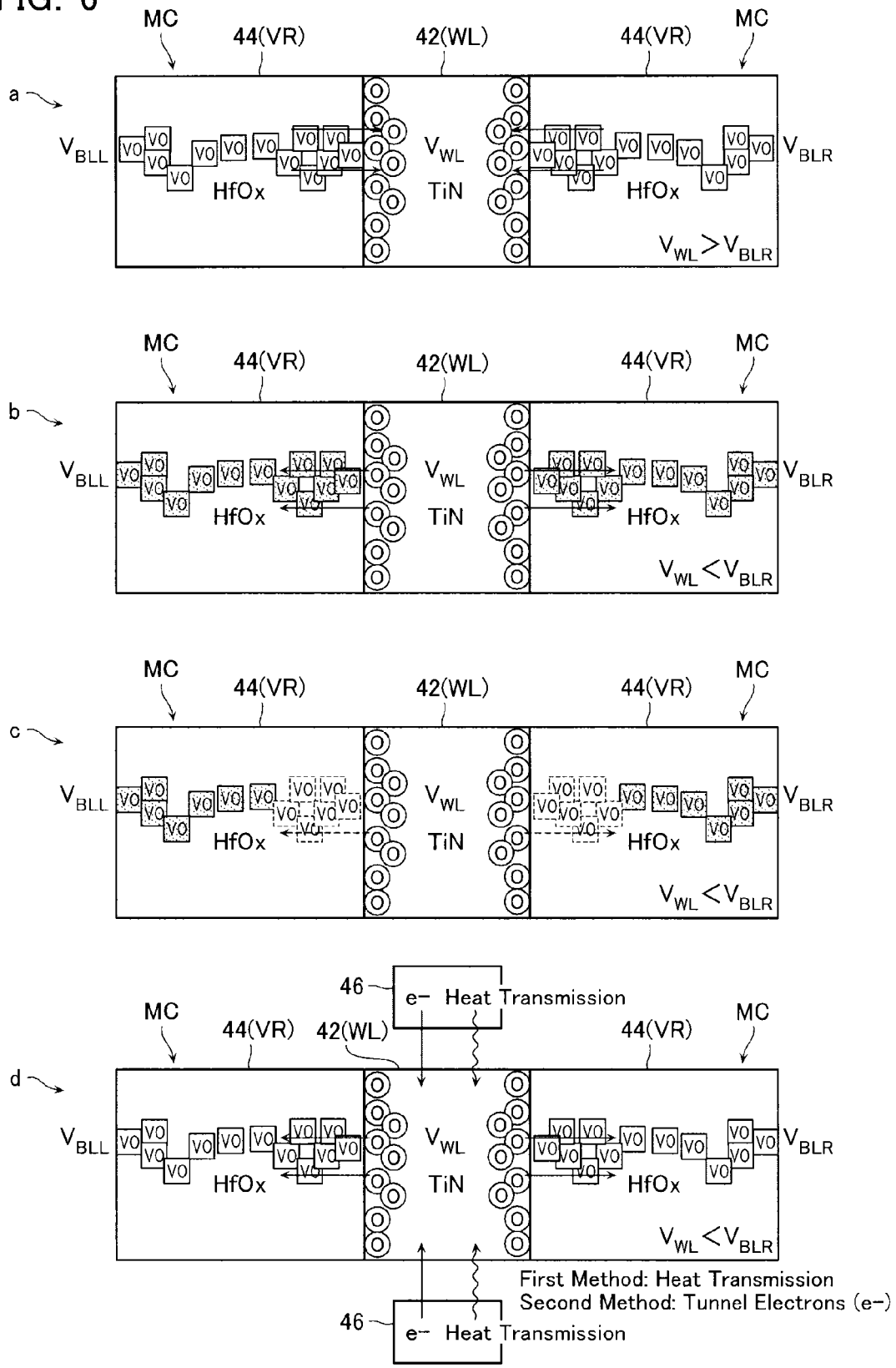
FIG. 6 contains cross-sectional schematic views each showing a configuration of a memory cell of the semiconductor memory device according to the first embodiment.

FIG. 6 contains cross-sectional schematic views for explaining the erase operation of the memory cell. FIGS. 6(*a*) to 6(*c*) show an erase operation according to a comparative example, and FIG. 6(*d*) shows the erase operation according to the first embodiment. Now, an example where TiN is employed as the third conductive layer 42 (word line WL) and HfOx is employed as the variable resistance layer 44 (VR), will be described, but a specific form of the first embodiment is not limited to this example.

FIG. 6(*a*) shows the memory cell MC in a data write state. During the data write operation (setting operation), negatively charged oxygen ions separate from the variable resistance layer 44 to be absorbed in an electrode on a third conductive layer 42 (word line WL) side, due to a gradient of voltage provided to the variable resistance layer 44. Focusing on a right side memory cell MC portion of FIG. 6(*a*), a direction of such a voltage gradient corresponds to a magnitude relationship of a voltage VWL of the word line WL sandwiched by the variable resistance layers 44 and a voltage VBLR on same bit line side being VWL>VBLR. As a result, an oxygen deficiency is generated in the variable resistance layer 44 which is an insulator, and a filament that easily passes a current is formed. As a result, the variable resistance layer 44 attains the low-resistance state (write state). At this time, a vicinity of a surface on the variable resistance layer 44 side in the third conductive layer 42 (word line WL) functions as a reservoir of oxygen ions and attains a state of being able to absorb and emit oxygen ions.

FIG. 6(*b*) shows a state where the erase operation (resetting operation) of data has started. The magnitude relationship of applied voltages at this time is VWL<VBLR, reversely to during the setting operation. As a result, negatively charged oxygen ions are attracted to the bit line BL side and penetrate into the variable resistance layer 44 to cause pair annihilation with the oxygen deficiency, whereby the oxygen returns to an atomic position of the transition metal oxide. As a result, the oxygen deficiency in the variable resistance layer 44 is annihilated in order from closest to the word line WL, and the memory cell MC undergoes transition to the high-resistance state (erase state).

However, sometimes, when annihilation of the oxygen deficiency proceeds to a certain extent, the erase operation ends up finishing in an insufficient state without oxygen ions reaching the oxygen deficiency positioned on the bit line BL side. This will be explained below using FIG. 6(*c*). In FIG. 6(*c*), the oxygen deficiency shown by a broken line means one where the oxygen deficiency has already been pair annihilated with the oxygen ion, and the oxygen deficiency shown by a solid line means one where the oxygen deficiency still remains. In order for oxygen ions to migrate efficiently inside the variable resistance layer 44, there is preferably heating by Joule heat. Moreover, limiting discussion to the variable resistance layer 44, a source of generation of this Joule heat is a current flowing in an oxygen deficiency portion acting as the filament. However, it should be noted that as shown in FIG. 6(*c*), in the very region where oxygen deficiency has been annihilated, a large amount of current no longer flows, hence the current cannot be expected to act as a Joule heat source. That is, the oxygen deficiency portion where the oxygen ions have already been pair annihilated no longer generates heat directly, and the only way for oxygen ions to be able to migrate efficiently is to wait for a temperature rise due to heat conduction from another region in the variable resistance layer 44 where the oxygen deficiency still exists and a large amount of current can flow.

Accordingly, in a configuration according to the first embodiment, as shown in FIG. 6(*d*), heat is supplied to the word line WL using wiring line layers disposed above and below the word line WL (arrows in FIG. 6(*d*)). This makes it possible to secure a high temperature required for the oxygen ions to migrate efficiently inside the variable resistance layer 44 using not only an electric field but also heat as a driving force, thereby enabling the erase operation of the memory cell MC to be performed efficiently. This will be described in detail below.

Figure 7:
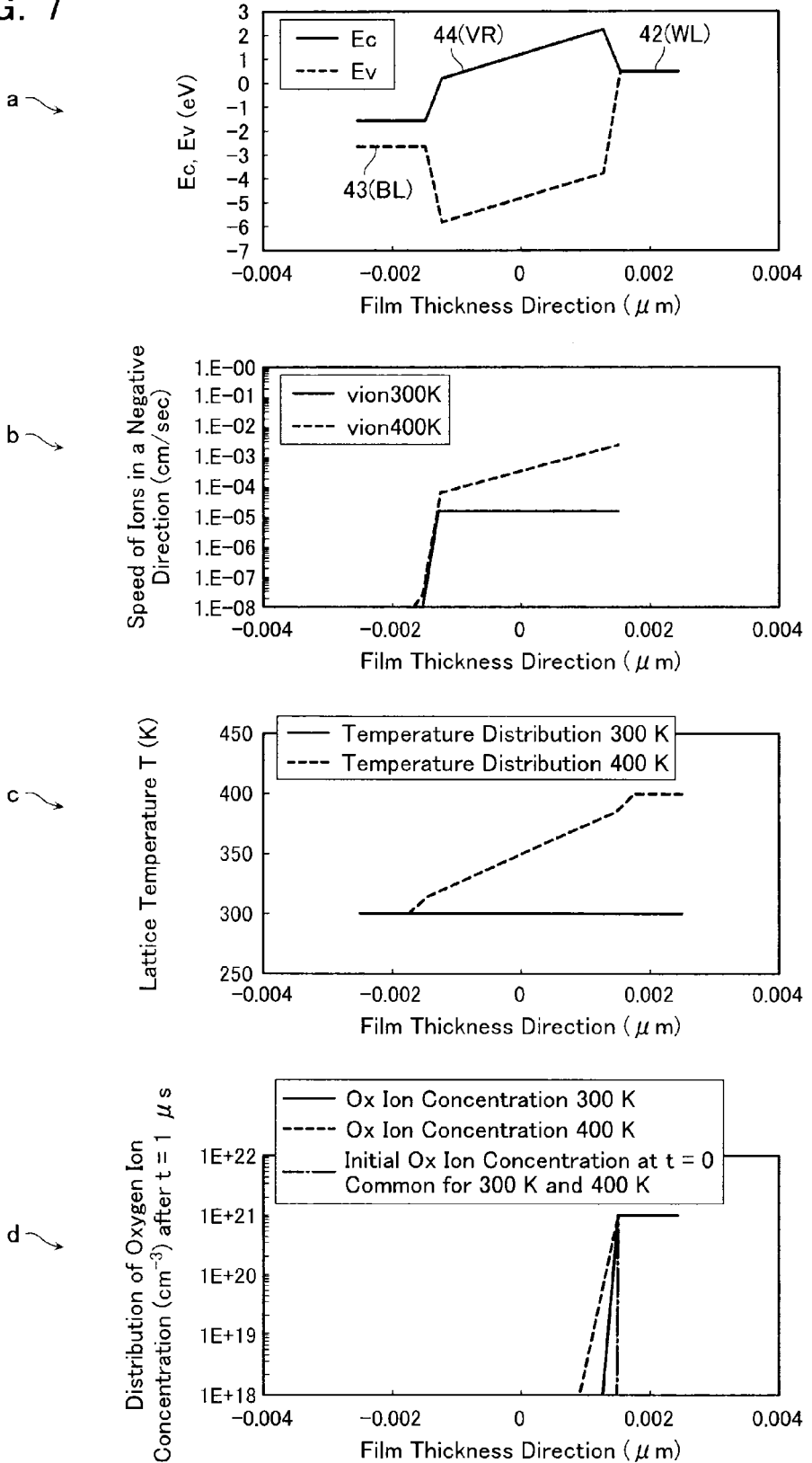
FIG. 7 contains graphs showing various kinds of simulation results in the semiconductor memory device according to the first embodiment.

FIG. 7 contains graphs showing various kinds of simulation results in the semiconductor memory device according to the first embodiment. FIG. 7(a) is a graph showing a band structure of the memory cell MC including the variable resistance layer 44. The vertical axis of the graph indicates magnitude of energy [eV], and the horizontal axis of the graph indicates film thickness [μm]. In the present simulation, the columnar conductive layer 43 (bit line BL) is assumed to be polysilicon, the variable resistance layer 44 is assumed to be HfOx of thickness 3 nm, and the third conductive layer 42 (word line WL) is assumed to be TiN. Ec and Ev in the graph indicate a lower end of a conductive band and an upper end of a valence band, respectively. A region where a large band gap (Ec-Ev) in the center is formed corresponds to the variable resistance layer 44 of the memory cell MC. The right side of the graph corresponds to the third conductive layer 42 (word line WL) side, and the left side of the graph corresponds to the columnar conductive layer 43 (bit line BL) side.

Now, according to non-patent document S. Yu, IEDM2011, migration rate of oxygen ions in the variable resistance layer 44 during the resetting operation is indicated by the following mathematical expression $$v = a/t_0 \exp(-Ea/k_B T) \sin(qaF/k_B T)$$

Now, a is an approximate lattice constant [cm] of the variable resistance layer 44, T is lattice temperature [K] of the variable resistance layer 44, kB is the Boltzmann constant, Ea is active energy [eV] of an ion, t0 is oscillation time [s] of an ion, q is an elementary charge, and F is an electric field applied to the variable resistance layer 44. Note that the electric field F is originally a vector quantity, but for simplification, in the present simulation, calculation is performed by an electric field that is one-dimensional in the thickness direction.

FIG. 7(b) is a graph showing speed of oxygen ions in a negative direction. The vertical axis indicates speed [cm/sec] of oxygen ions, and the horizontal axis indicates film thickness [μm]. The line indicated by vion300K in the graph shows migration speed of ions when the temperature of the third conductive layer 42 (word line WL) is 300 [K], and the line indicated by vion400K in the graph shows migration speed of ions when the temperature of the third conductive layer 42 (word line WL) is 400 [K]. It is found that when the temperature is 300 [K] (room temperature), migration rate of ions is constant irrespective of position in the film thickness direction, but when the third conductive layer 42 (word line WL) is heated to 400 [K], migration rate of ions improves. Specifically, migration rate of ions increases the closer the third conductive layer 42 (word line WL), that is, the heat source, is approached.

FIG. 7(c) is a graph showing lattice temperature in the variable resistance layer 44. The vertical axis indicates lattice temperature T [K], and the horizontal axis indicates film thickness [μm]. As shown in FIG. 7(c), the lattice temperature in the variable resistance layer 44 is constant when the temperature of the third conductive layer 42 (word line WL) is set to 300 [K], but has a shape that linearly decreases with increasing separation from the third conductive layer 42 when the temperature of the third conductive layer 42 (word line WL) is set to 400 [K]. Viewing this along with FIG. 7(b), migration rate of oxygen ions is found to lower with decrease of lattice temperature.

FIG. 7(d) is a graph showing a concentration distribution of oxygen ions at a time point t=0 [s], and a concentration distribution of oxygen ions at a time point t=1 [μs]. The vertical axis of the graph indicates oxygen ion concentration [cm−3], and the horizontal axis of the graph indicates film thickness [μm]. As shown in FIG. 7(d), at time point t=0 [s], oxygen ions (Ox) do not exist in the variable resistance layer 44. At time point t=1 [μs], oxygen ions are found to reach further when the temperature of the third conductive layer 42 (word line WL) is set to 400 [K] compared to when the temperature of the third conductive layer 42 (word line WL) is set to 300 [K].

It is assumed from the above result that in order to effectively feed the variable resistance layer 44 with the oxygen ions required in annihilation of the oxygen deficiency, it is advantageous to apply a voltage to the variable resistance layer 44 and heat the third conductive layer 42 (word line WL).

Figure 8:
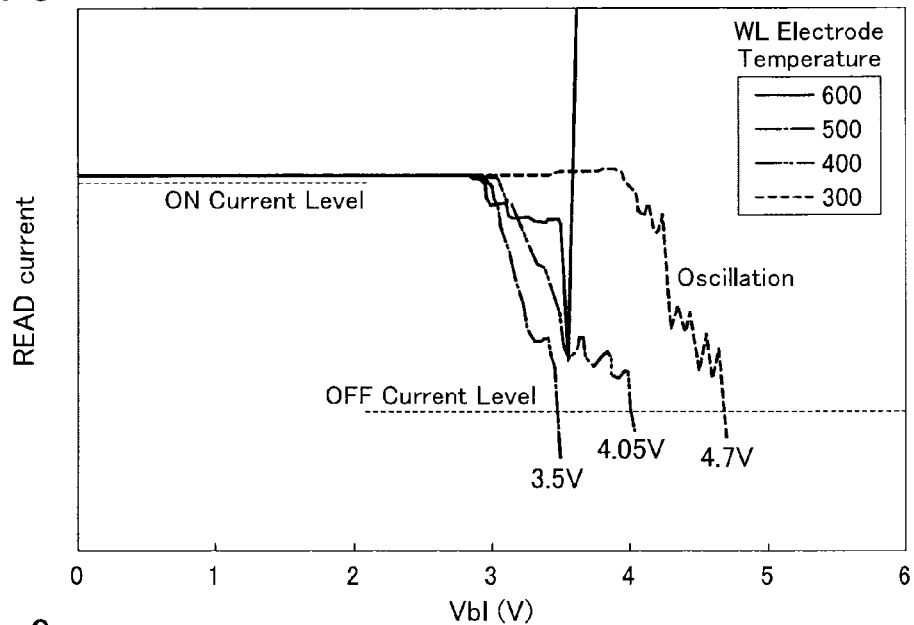
FIG. 8 is a graph showing a simulation result during a resetting operation of the semiconductor memory device according to the first embodiment.

FIG. 8 is a graph showing a simulation result during the resetting operation of the semiconductor memory device according to the first embodiment. The vertical axis indicates magnitude of a current flowing in the memory cell MC, and the horizontal axis indicates a voltage applied to the bit line BL. A state of the memory cell is configured to switch from the write state (set state) indicated by an ON power source level in FIG. 8 to the erase state (reset state) indicated by an OFF power source level in FIG. 8, when the applied voltage becomes a constant voltage or larger.

As shown in FIG. 8, the magnitude of the voltage applied to the variable resistance layer 44 required in switching lowers sequentially from 4.7 V to 4.05 V and 3.5 V, as the temperature of the word line WL is raised from 300 [K] to 400 [K] and 500 [K]. In this way, the erase operation can be performed more efficiently at a low application voltage, the higher is the temperature of the word line WL (third conductive layer 42). However, when the temperature of the word line WL becomes 600 K, separation of oxygen ions from the variable resistance layer 44 is promoted, leading to the phenomenon that in spite of the resetting operation being intended, the setting operation, that is, precisely the opposite operation gets promoted. It is clear from the above that during the resetting operation, the temperature of heating the word line WL is preferably set to 400 [K] or more, and in particular is preferably set to approximately 500 [K].

As described above, in the semiconductor memory device according to the first embodiment, by performing an operation that supplies heat to the word line WL (second operation) in conjunction with the resetting operation (first operation) during that resetting operation, the migration rate of oxygen ions can be improved and an efficient erase (resetting) can be performed at a low voltage. As mentioned previously, supply of heat to the word line WL is performed using the wiring line layer 46 disposed above and below the word line WL via the third inter-layer insulating layer 41. The following two types of methods are possible.

A first method is a method that heats the word line WL (third conductive layer 42) by causing a potential difference between one end and the other end of the wiring line layer 46 and generating heat in the wiring line layer 46, thereby causing that heat to be conducted via the third inter-layer insulating layer 41. In the case of using this method, it is preferable that a material, a cross-sectional area, a length, and so on, of the wiring line layer 46 are appropriately selected such that a resistance value of the wiring line layer 46 is raised and heat is easily generated. Specifically, the cross-sectional area of the wiring line layer 46 is preferably made smaller than a cross-sectional area of the third conductive layer 42 (word line WL). This makes it possible to increase the electrical resistance value of the wiring line layer 46 to make heat more easily generated, and to contribute to miniaturization of the device.

A second method is a method that generates a potential difference between the wiring line layer 46 and the word line WL (third conductive layer 42), and generates a tunnel current that flows in the third inter-layer insulating layer 41. For example, it is possible for a potential VWL of the word line WL during the resetting operation to be set to a ground potential (0 V), and for the wiring line layer 46 to be set to a negative voltage. As a result, electrons (−e) injected toward the word line WL from the wiring line layer 46 undergo scattering in the word line WL to lose kinetic energy and provide energy to atoms configuring the word line WL, whereby the word line WL can be heated. It should be noted that in this second method, the injected electrons do not undergo such a scattering as to lose kinetic energy in a process of tunneling into the insulating layer 41, hence simply generate heat in the word line. That is, whereas in the first method, temperature of the word line WL (third conductive layer 42) is raised indirectly by heat transmitted across the insulating layer 41 from the wiring line layer 46 which is a heat generating portion, in this second method, the word line WL (third conductive layer 42) itself is the heat generating portion and temperature of the word line WL (third conductive layer 42) rises directly.

As described above, in the first method, the wiring line layer 46 forms the heat generating portion. Therefore, preferably employed as the material of the wiring line layer 46 when implementing the first method is a material having high thermal conductivity and excelling in heat resistance. For example, the following may be employed, that is, tungsten (W), molybdenum (Mo), tantalum (Ta), ruthenium (Ru), rhodium (Rh), iridium (Ir), osmium (Os), or a compound including these elements. In addition, titanium nitride (TiN) may also be employed. On the other hand, as also described above, in the second method, the wiring line layer 46 does not form the heat generating portion. Although there is indirect temperature rise of the wiring line layer 46 due to heat transmitted in a wiring line layer 46 direction from the word line WL (third conductive layer 42), the material of the wiring line layer 46 need not necessarily be a material having high thermal conductivity and high heat resistance. Rather, when a negative voltage is applied to the wiring line layer 46, a material having a small electrical resistance is desirable so as to prevent an excessive voltage drop occurring inside the wiring line layer 46 and prevent a role of the wiring line layer 46 as a cathode (electron injection source) from being hindered. Therefore, employable as the material of the wiring line layer 46 when implementing the second method is, in addition to the materials in the first method mentioned above, a material whose melting point is lower than these (of poor heat resistance) but whose electrical resistance is low, for example, copper (Cu), gold (Au), and silver (Ag).

Whichever of the above-described first method and second method is adopted, by setting the variable resistance layer 44 to high temperature via temperature rise of the word line WL, the migration rate of oxygen ions can be improved and the resetting operation can be efficiently performed. Described above was the situation of the resetting operation of the memory cell MC on the right side described in FIGS. 6(*a*) to 6(*d*), but, in the same way, when it is desired to simultaneously reset also the memory cell MC on the left side, if a voltage satisfying VWL<VBLL=VBLR is applied, then due to the effect of temperature rise of the word line WL and the effect of an electric field between the word line WL and the bit line BL disposed separated by the variable resistance layer 44, the memory cell MC on the left side can have the resetting operation performed symmetrically thereon similarly to the right side. Conversely, when it is not desired to simultaneously reset the memory cell MC on the left side, if a voltage satisfying VBLL≤VWL<VBLR is applied, then the memory cell MC on the right side can be preferentially reset in order to prevent negatively charged oxygen ions from preferentially flowing into the left side variable resistance layer 44 from the word line WL due to an electric field effect.

Second Embodiment

A second embodiment is an example where a wiring line layer is not provided between the word lines.

Figure 9:
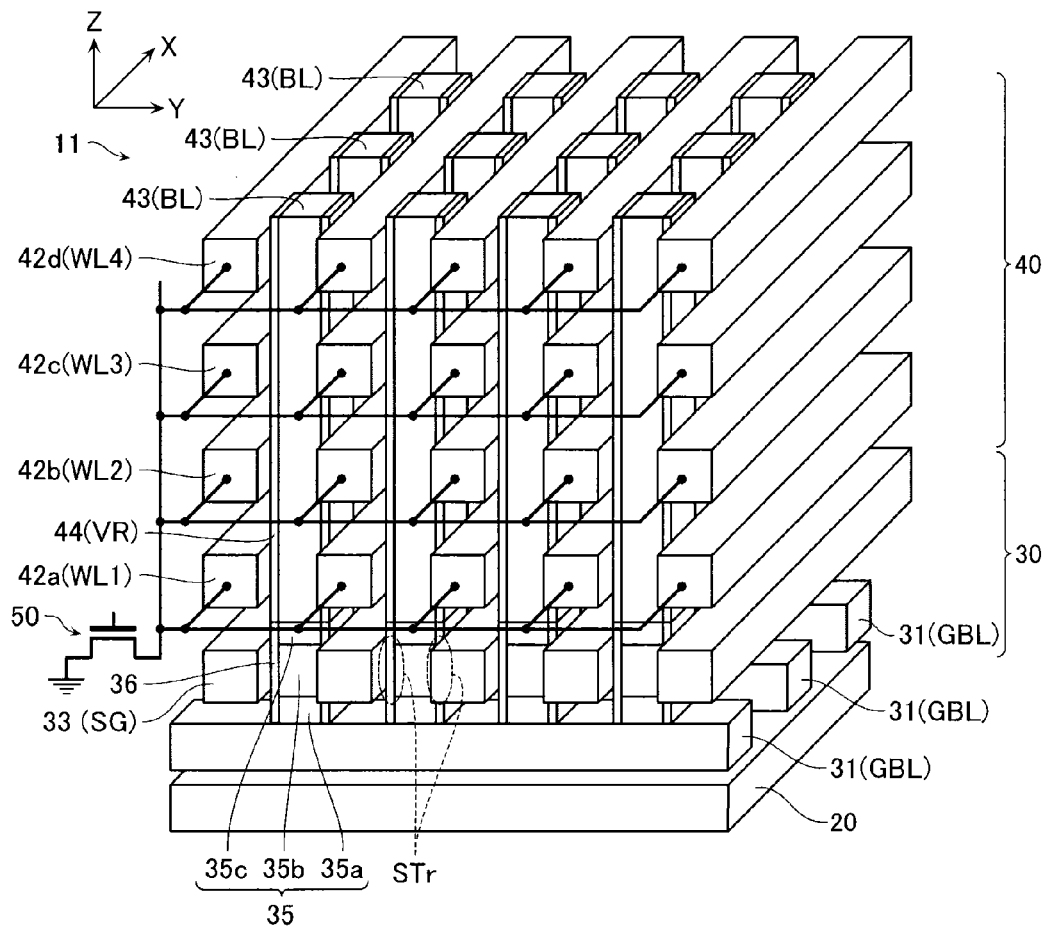
FIG. 9 is a schematic perspective view showing a configuration of a memory cell array of a semiconductor memory device according to a second embodiment.

FIG. 9 is a schematic perspective view showing a configuration of a memory cell array of a semiconductor memory device according to the second embodiment. A detailed description of portions shared with the first embodiment (FIG. 3) will be omitted. As shown in FIG. 9, in the memory cell array 11 according to the second embodiment, one ends of the word lines WL1 to WL4 are commonly connected to the ground voltage via a switch element 50. In the present embodiment, an electric field effect type transistor is employed as the switch element, but it is also possible for another switch element to be employed.

In the semiconductor memory device according to the second embodiment, a voltage gradient is generated in the word lines WL1 to WL4 by setting the switch element 50 to on (second operation) during the resetting operation (first operation). As a result, heat is generated in the word line WL, and it becomes possible to supply Joule heat to the memory cell MC. As a result, the migration rate of oxygen ions can be improved and the resetting operation can be performed efficiently, in the same way as in the first embodiment. In the present embodiment, one end of the switch element was set to the ground potential, but it is also possible to employ another potential provided it is a potential allowing a voltage gradient to be formed in the word line WL during the resetting operation as described above.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of first lines extending in a first direction perpendicular to a substrate surface and arranged with a certain pitch in a second direction parallel to the substrate surface;
a plurality of second lines extending in the second direction and arranged with a certain pitch in the first direction;
a memory cell provided at an intersection of the first line and the second line and including a variable resistance element;
a third line extending in the second direction between the plurality of second lines; and
a control circuit capable of executing a first operation that changes a resistance value of the variable resistance element by applying a voltage to the memory cell via the first line and the second line, and a second operation that supplies heat to the memory cell using the third line.

2. The semiconductor memory device according to claim 1, wherein
the control circuit generates a potential difference between the second line and the third line in the second operation.

3. The semiconductor memory device according to claim 1, wherein
the control circuit generates a potential difference between one end and the other end of the third line in the second operation.

4. The semiconductor memory device according to claim 3, wherein
a cross-sectional area of the third line is smaller than a cross-sectional area of the second line.

5. The semiconductor memory device according to claim 1, wherein
the third line includes tungsten or molybdenum.

* * * * *